United States Patent
Lalonde

(10) Patent No.: US 7,292,043 B2
(45) Date of Patent: Nov. 6, 2007

(54) ELECTRONICALLY RESETTABLE CURRENT PROTECTION FOR DIE TESTING

(75) Inventor: Andre Lalonde, Allen, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/538,500

(22) Filed: Oct. 4, 2006

(65) Prior Publication Data

US 2007/0096753 A1    May 3, 2007

Related U.S. Application Data

(60) Provisional application No. 60/730,800, filed on Oct. 27, 2005.

(51) Int. Cl.
*G01R 31/08* (2006.01)

(52) U.S. Cl. ........................... 324/522; 324/719

(58) Field of Classification Search .............. 324/719, 324/522

See application file for complete search history.

(56) References Cited

U.S. PATENT DOCUMENTS

| | | | |
|---|---|---|---|
| 6,052,268 A * | 4/2000 | Thomas | 361/103 |
| 6,169,391 B1 * | 1/2001 | Lei | 323/266 |
| 6,545,479 B1 * | 4/2003 | Dollar et al. | 324/424 |
| 6,791,315 B2 * | 9/2004 | Skerritt et al. | 324/126 |
| 7,180,719 B2 * | 2/2007 | Whitney | 361/119 |

* cited by examiner

*Primary Examiner*—Walter Benson
(74) *Attorney, Agent, or Firm*—Workman Nydegger

(57) ABSTRACT

Electronically reset table test apparatus. The test apparatus includes an electronically operable current breaker connected to a test jig for testing semiconductor die. The electronically operable current breaker is connected through an interface that converts signals to signals appropriate for use on a computer bus to a computer system. The test apparatus can detect faults in the semiconductor die and open the electronically operable current breaker in response to detecting the fault. The electronically operable current breaker can be closed when the fault is removed.

20 Claims, 2 Drawing Sheets

ELECTRONICALLY RESETTABLE CURRENT PROTECTION FOR DIE TESTING

CROSS-REFERENCE TO RELATED APPLICATIONS

This application claims the benefit of U.S. Provisional Application No. 60/730,800, titled "Electronically Reset table Current Protection For Die Testing" filed Oct. 27, 2005, which is incorporated herein by reference.

BACKGROUND OF THE INVENTION

1. The Field of the Invention

The invention generally relates to the filed of component testing. More specifically, the invention relates to current protection used in test apparatuses for component testing.

2. Description of the Related Art

Manufacturing is an essential industry to provide products for all aspects of life. Manufacturing produces everything from large machinery to microscopic components such as those found in semiconductor chips. A part of the manufacturing process is quality control. Quality control helps to assure that manufactured components meet the expectations of consumers and the standards that a manufacturing facility sets for itself. High standards that translate to high quality components can set one manufacturer apart from other manufacturers. Quality control can include several components including inspection and testing.

Testing may include several components, including functional testing and burn in testing. Functional testing tests components to make sure that they perform within acceptable limits. Additionally, and especially in testing of devices like electrical devices, functional testing may be done to determine a device's ratings. Illustratively, one type of electrical device is the semiconductor laser. A semiconductor laser functions by producing coherent light in response to a current passed through the laser. Functional testing may be performed to determine how much current is needed for the laser to begin producing coherent light. Further, functional testing may also be used to determine how much coherent light is produced as a function of the current that is passed through the semiconductor laser. The semiconductor laser fails functional testing if it does not produce light or does not produce light at a sufficiently low current. Even if the semiconductor laser produces light at a sufficiently low current, the semiconductor laser has specific characteristics. Semiconductor lasers can be sorted into categories depending on their specific characteristics, which are discovered through functional testing.

Burn in testing tests devices for a period of time to make sure that the devices are not prone to failure. For example, a device may be connected to a power source and operated for a period of time. After the device has operated satisfactorily for a sufficient period of time, one can be reasonably assured that the device will not fail prematurely when finally installed in an end product.

Often, a device will contain flaws such that when connected for testing, the device causes a "short circuit" to the power source being used to test the device. In the example described above with a semiconductor laser, this may occur because of impurities in the semiconductor laser epitaxial structure or due to metal that has not been properly etched or for other reasons. These short circuits can causes fuses to blow or breakers to trip in the power source or in a source supplying the power source. Blown fuses and tripped breakers will halt testing at a test station until the fuse has been changed or the breaker reset. This clearly can cause inefficiencies in the testing process and can result in delays and increased costs.

BRIEF SUMMARY OF THE INVENTION

One embodiment described herein includes a test apparatus for testing a semiconductor die. The test apparatus includes a test jig configured to accommodate the semiconductor die. A power source is connected to the test jig. The power source is configured to supply current to the semiconductor die. A current sensor is connected to the test jig. The current sensor is configured to sense current passing through the semiconductor die. An electronically operable current breaker is connected to the test jig. The electronically operable current breaker configured to selectively complete and break a circuit that includes the power source. A computer is included in the test apparatus. The computer is configured to receive signals from the current sensor and to selectively cause the electronically operable circuit breaker to break the circuit including the power source in response to receiving signals from the current sensor indicating that a fault has occurred in the semiconductor die. The computer is further configured to selectively cause the electronically operable circuit breaker to complete the circuit that includes the power source in response to the fault being removed. The test apparatus further includes an interface connectable between the computer, the current sensor and the electronically operable current breaker. The interface allows the computer to connect to the current sensor and the electronically operable current breaker through a port on the computer.

Another embodiment includes an interface for use in testing semiconductor dies. The interface includes a power source for supplying current to a semiconductor die. A current sensor is connected to the power source. The current sensor is configured to sense current passing through the semiconductor die. An electronically operable current breaker is connected to the power source for selectively completing or breaking a circuit between the semiconductor die and the power source. Circuitry is connected to the current sensor. The circuitry connected to the current sensor is configured to convert signals from the current sensor to a form that is readable by a computer bus. Circuitry is connected to the electronically operable current breaker. The circuitry connected to the electronically operable current breaker is configured to receive signals from the computer bus and in response generate signals to selectively control the electronically operable current breaker to open or close a circuit including the power source and the semiconductor die.

These and other features will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other features are obtained, a more particular description of embodiments briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Embodiments described herein relate to current protection apparatus to protect test equipment in the case of failure of a device during device testing. One embodiment includes for example a test jig that is designed to accommodate a semiconductor die. A power source is connected to the test jig. The power source is configured to supply current to the semiconductor die. A current sensor may be coupled to the test jig. The current sensor senses current passing through the semiconductor die. An electronically operable current breaker is connected to the test jig. The electronically operable current breaker can selectively complete and break a circuit that includes the power source. The computer may be configured to receive signals from the current sensor and to selectively, cause the electronically operable circuit breaker to break a circuit in response to receiving signals from the current sensor indicating that a fault has occurred in the semiconductor die. The computer may further be configured to complete a circuit that includes the power source once the fault is removed. An interface is included between the computer and the current sensor and electronically operable current breaker. The interface allows the computer to connect to the current sensor and electronically operable current breaker through a port on the computer.

Figure 1:
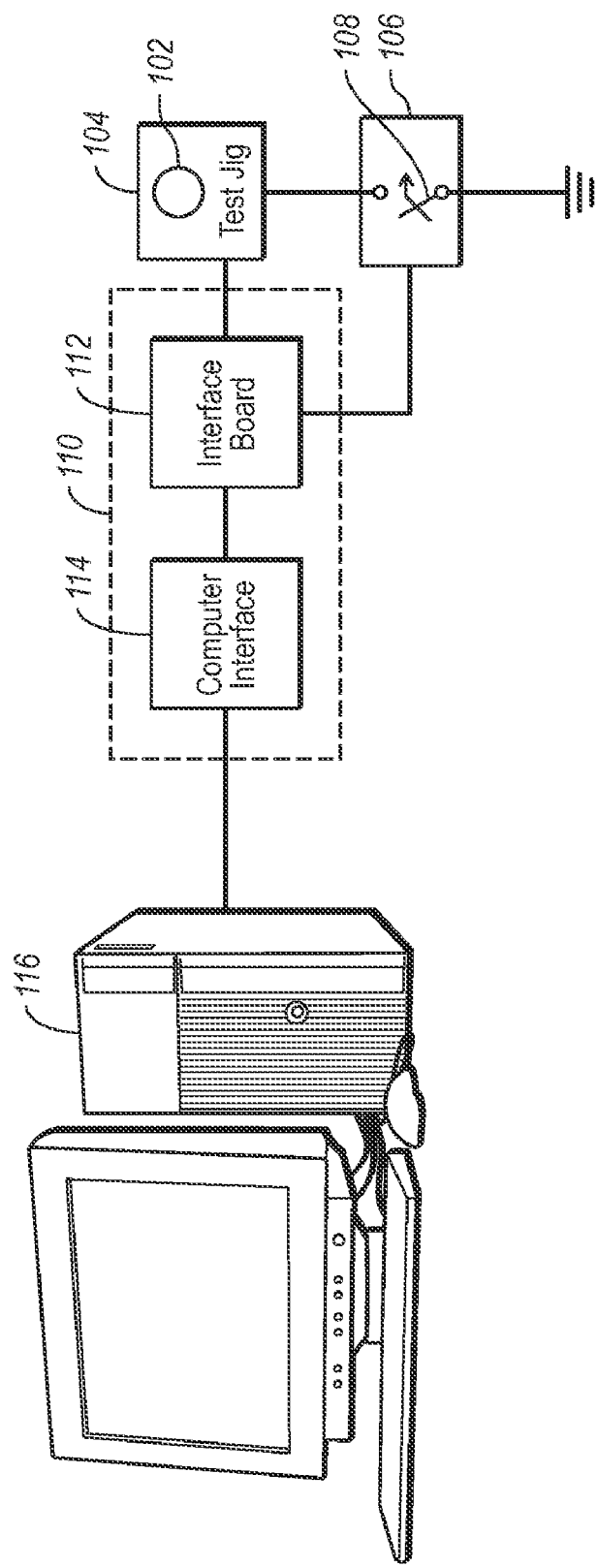
FIG. 1 illustrates a test topology including a test apparatus.

Referring now to FIG. 1, a test topology example is illustrated where a semiconductor die 102 is placed in a test jig 104 for testing. The semiconductor die 102 may include for example, laser diodes, light emitting diodes (LED), photo diodes, or other types of semiconductor devices. The test jig 104 may include any one of a number of suitable test jig apparatus is.

FIG. 1 also illustrates an electronically operable current breaker 106 connected to the test jig 104. The electronically operable current breaker 106 includes a switching mechanism 108 that allows the electronically operable current breaker 106 to selectively complete and break a circuit that includes a power source that supplies power to the semiconductor die 102 through the test jig 104. The electronically operable circuit breaker 106 may include for example a transistor such as the transistor shown in FIG. 2 at 202. Alternatively, the electronically operable current breaker 106 may include a silicon controlled relay (SCR), a mechanical relay, or other suitable current breaking means. The electronically operable current breaker 106 is connected to an interface 110 such that the interface 110 can provide signals to selectively open and close a circuit. The electronically operable circuit breaker 106 may be included as a separate component or as a part of the interface 110. The interface 110 may include circuitry coupled to the current sensor. The circuitry coupled to the current sensor is configured to convert signals from the current sensor to a form that is readable by a computer bus. The interface 110 may further include circuitry coupled to the electronically operable current breaker. The circuitry coupled to the electronically operable current breaker is configured to receive signals from the computer bus and in response generate signals to selectively control the electronically operable current breaker to open or close a circuit including the power source and a semiconductor die.

The interface 110 may include various sub-components. For example as shown in FIG. 1, the interface 110 includes an interface board 112 and a computer interface 114. The interface board 112 shown in FIG. 1 includes a power source connected to the test jig 104 for supplying current to the semiconductor die 102. The computer interface 114 provides in the example shown an interface between a port on a computer 116 and the interface board 112. In one embodiment, the computer interface 114 may be for example the I2C/SPI Host Adapter. This particular device provides an interface between a USB port on the computer to an SPI interface. The interface board 112 may include in SPI interface for connecting to the computer interface 114. The interface board 112 further includes logic for controlling various inputs and outputs such as for example he control line to the electronically operable current breaker 106 for completing and breaking the circuit supplying current to the semiconductor die 102.

Figure 2B:
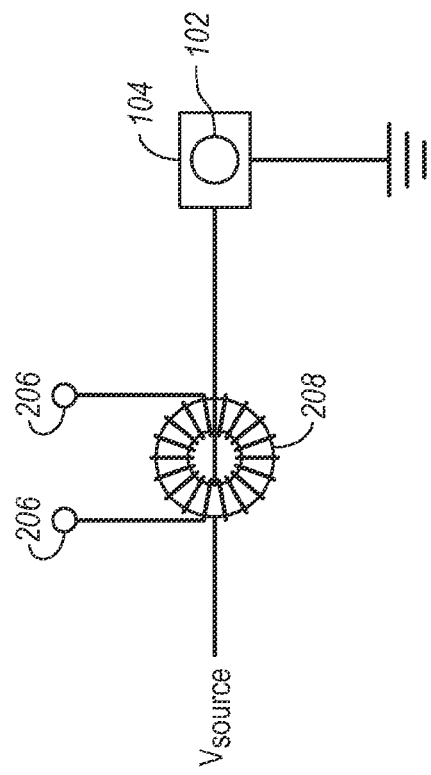
FIG. 2 illustrates examples of current sensors and current breakers.
Figure 2A:
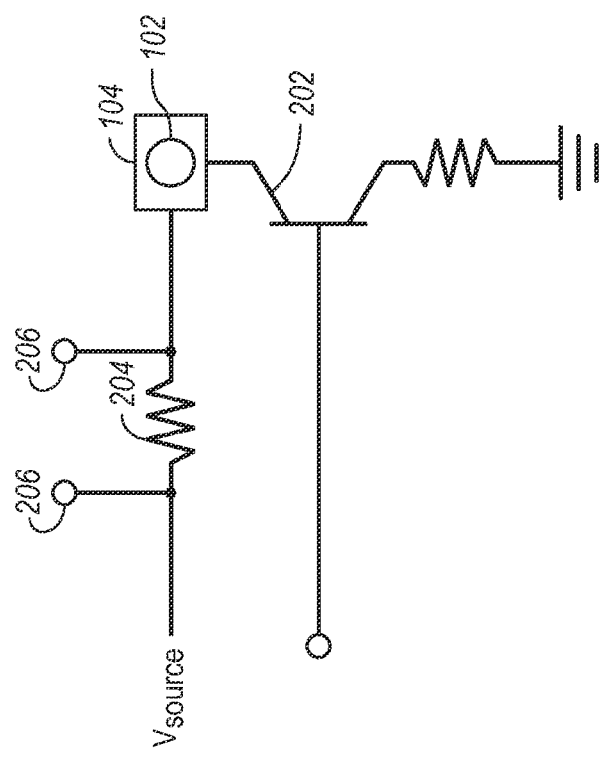

The embodiment illustrated in FIG. 1 may also include a current sensor illustrated more fully in FIGS. 2A and 2B. In one embodiment the current sensor may include a resistor 204. By measuring a voltage drop across the resistor 204 at terminals 206 the amount of current passing through the semiconductor die 102 can be calculated. In one embodiment, it may be desirable to physically position the resistor 204 such that it is in close proximity to the semiconductor die 102. Typically, the current sense resistor 204 has a low Ohm value to limit the size of the voltage drop across to resistor 204. This may require that the resistor 204 is of a higher Wattage. FIG. 2B illustrates an example where a toroid coil 208 may be used alternatively as a portion of the current sensor.

Referring once again to FIG. 1, a computer 116 may be connected to the interface 110. In the example shown, the computer 116 is connected to the interface 110 through a computer interface 114. As mentioned previously the computer interface 114 may be such that it is configured to connect to a computer port on the computer 116. For example, the computer port on the computer 116 may include any one of an RS232 serial port, a USB port, a parallel port, an IEEE 1394 port, a wireless connection, a network connection, or any other appropriate port.

The computer 116 may be configured to perform various functions. For example the computer may be configured to receive signals from the current sensor through the interface 110. The computer can then selectively cause the electronically operable circuit breaker 106 to break a circuit that includes a power source to supply the semiconductor die 102 in response to receiving signals from the current sensor indicating that a fault has occurred in the semiconductor die 102. In addition, the computer 116 may be configured to complete a circuit that includes the power source to the semiconductor die 102 in response to a fault being removed at the test jig 104. This allows the computer 116 to detect when a semiconductor die has failed indicated by a short circuit through the die and to automatically reset the electronically operable current breaker when a new semiconductor die 102 has been placed in the test jig 104. The computer 116 may perform other functions including reporting functions for reporting short circuit failures and for tracking the results of any testing performed at the test jig 104.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A test apparatus for testing a semiconductor die, the test apparatus comprising:
   a test jig configured to accommodate the semiconductor die;
   a power source connected to the test jig and configured to supply current to the semiconductor die;
   a current sensor coupled to the test jig, the current sensor configured to sense current passing through the semiconductor die;
   an electronically operable current breaker connected to the test jig, the electronically operable current breaker configured to selectively complete and break a circuit that includes the power source;
   a computer configured to receive signals from the current sensor and to selectively cause the electronically operable circuit breaker to break the circuit including the power source in response to receiving signals from the current sensor indicating that a fault has occurred in the semiconductor die, the computer further configured to selectively cause the electronically operable circuit breaker to complete the circuit that includes the power source in response to the fault being removed; and
   an interface connectable between the computer, the current sensor and the electronically operable current breaker, wherein the interface allows the computer to connect to the current sensor and the electronically operable current breaker through a port on the computer.

2. The test apparatus of claim 1, wherein the port on the computer is an RS232 serial port.

3. The test apparatus of claim 1, wherein the port on the computer is a USB port.

4. The test apparatus of claim 1, wherein the port on the computer is a parallel port.

5. The test apparatus of claim 1, wherein the port on the computer is an IEEE 1394 port.

6. The test apparatus of claim 1, wherein the port on the computer is a wireless connection.

7. The test apparatus of claim 1, wherein the interface comprises a USB to SPI interface.

8. The test apparatus of claim 1, wherein the current sensor comprises a current sense resistor.

9. The test apparatus of claim 1, wherein the current sensor comprises a coil.

10. The test apparatus of claim 1, wherein the electronically operable current breaker comprises a transistor.

11. The test apparatus of claim 1, wherein the electronically operable current breaker comprises a silicon controlled relay.

12. The test apparatus of claim 1, wherein the electronically operable current breaker comprises a mechanical relay.

13. An interface for use in testing semiconductor dies, the interface comprising:
   a power source for supplying current to a semiconductor die;
   a current sensor coupled to the power source, the current sensor configured to sense current passing through the semiconductor die that is indicative of a fault in the semiconductor die;
   an electronically operable current breaker coupled to the power source for selectively completing or breaking a circuit between the semiconductor die and the power source;
   circuitry coupled to the current sensor the circuitry coupled to the current sensor configured to convert signals from the current sensor to a form that is readable by a computer bus; and
   circuitry coupled to the electronically operable current breaker, the circuitry coupled to the electronically operable current breaker configured to receive signals from the computer bus and in response generate signals to selectively control the electronically operable current breaker to open or close a circuit including the power source and the semiconductor die, wherein the circuitry opens the electronically operable current breaker when the fault is indicated by the sensed current passing through the semiconductor die.

14. The interface of claim 13, wherein the computer bus is a SPI bus.

15. The interface of claim 13, wherein the electronically operable current breaker comprises a current sensing resistor.

16. The interface of claim 13, wherein the electronically operable current breaker comprises a coil.

17. The interface of claim 13, wherein the electronically operable current breaker comprises a transistor.

18. The interface of claim 13, wherein the electronically operable current breaker comprises a silicon controlled relay.

19. The interface of claim 13, wherein the electronically operable current breaker comprises a mechanical relay.

20. An interface for use in testing semiconductor dies, the interface comprising:
   means for supplying current to a semiconductor die;
   means for sensing current passing through the semiconductor die that is indicative of a short circuit condition in the semiconductor die;
   means for selectively completing or breaking a circuit between the semiconductor die and the power source;
   means for converting signals from the current sensor to a form that is readable by a computer bus; and
   means for receiving signals from the computer bus and in response generating signals to selectively control the electronically operable current breaker to open or close a circuit including the power source and the semiconductor die, wherein the means for receiving closes or opens the circuit when the current indicates a short circuit condition in the semiconductor die.

* * * * *

UNITED STATES PATENT AND TRADEMARK OFFICE
CERTIFICATE OF CORRECTION

PATENT NO. : 7,292,043 B2  Page 1 of 1
APPLICATION NO. : 11/538500
DATED : November 6, 2007
INVENTOR(S) : Lalonde It is certified that error appears in the above-identified patent and that said Letters Patent is hereby corrected as shown below:

Column 3
Line 25, change "selectively," to --selectively--
Line 27, change "sensor" to --sensor,--
Line 41, change "apparatus is" to --apparatuses--
Line 50, change "FIG. 2" to --FIG. 2A--
Line 64, after "current breaker", add [106]
Line 65, after "current breaker", add [106]

Column 4
Line 1, after "current breaker", add [106]
Line 17, change "as for example he" to --as, for example, the--
Line 30, after "across", remove [to]
Line 31, change "that the resistor 204 is" to --the resistor 204 to be--
Line 57, change "failed" to --failed, which is--
Line 58, change "die" to --die,--

Signed and Sealed this

Fourteenth Day of September, 2010

David J. Kappos
*Director of the United States Patent and Trademark Office*